United States Patent
Lee et al.

(10) Patent No.: US 7,648,556 B2
(45) Date of Patent: Jan. 19, 2010

(54) METHOD FOR MANUFACTURING NICKEL NANOPARTICLES

(75) Inventors: Young-Il Lee, Anyang-si (KR); Jae-Woo Joung, Suwon-si (KR); Kwi-Jong Lee, Suwon-si (KR)

(73) Assignee: Samsung Electro-Mechanics Co., Ltd., Suwon-Si (KR)

(*) Notice: Subject to any disclaimer, the term of this patent is extended or adjusted under 35 U.S.C. 154(b) by 154 days.

(21) Appl. No.: 11/708,508

(22) Filed: Feb. 21, 2007

(65) Prior Publication Data

US 2007/0237669 A1 Oct. 11, 2007

(30) Foreign Application Priority Data

| Apr. 11, 2006 | (KR) | ................ 10-2006-0032632 |
| Aug. 21, 2006 | (KR) | ................ 10-2006-0078618 |

(51) Int. Cl.
*B22F 9/24* (2006.01)
(52) U.S. Cl. .......................... 75/362; 75/374
(58) Field of Classification Search ........................ None
See application file for complete search history.

(56) References Cited

U.S. PATENT DOCUMENTS

| 6,494,931 B1* | 12/2002 | Mukuno et al. ............. 75/255 |
| 6,585,796 B2* | 7/2003 | Hosokura et al. ........... 75/373 |
| 7,527,752 B2* | 5/2009 | Yoon et al. ................. 252/513 |
| 2006/0289838 A1* | 12/2006 | Yoon et al. ............... 252/500 |

FOREIGN PATENT DOCUMENTS

| CN | 1127177 A | 7/1996 |
| CN | 1404424 A | 3/2003 |
| KR | 2004047101 A * | 6/2004 |
| KR | 10-0508693 | 8/2005 |
| WO | 87/00679 | 1/1987 |
| WO | WO-2008/060679 A2 * | 5/2008 |

OTHER PUBLICATIONS

Office Action issued in corresponding Korean Patent Application No. 10-2006-0078618, on Jul. 30, 2007.
Chinese Office Action mailed on Jun. 12, 2009 and issued in corresponding Chinese Patent Application 200710087255.6.

* cited by examiner

*Primary Examiner*—George Wyszomierski (57) ABSTRACT

A method of manufacturing nickel nanoparticles and nickel nanoparticles thus produced, having superior dispersion stability and smooth surface, by reducing after forming nickel-hydrazine complex in a reverse microemulsion, where the method includes forming an aqueous solution including nickel precursor, surfactant, and hydrophobic solvent, forming nickel-hydrazine complex by adding a reducing agent that includes hydrazine to the mixture, and producing nickel nanoparticles by adding a reducing agent to the mixture that includes the nickel-hydrazine complex.

15 Claims, 6 Drawing Sheets

METHOD FOR MANUFACTURING NICKEL NANOPARTICLES

CROSS-REFERENCE TO RELATED APPLICATIONS

This application claims the benefit of Korean Patent Applications No. 10-2006-0032632 filed on Apr. 11, 2006 and No. 10-2006-0078618 filed on Aug. 21, 2006, with the Korea Intellectual Property Office, the contents of which are incorporated here by reference in their entirety.

BACKGROUND

1. Technical Field

The present invention relates to a method of manufacturing nickel nanoparticles, in particular, to a method of manufacturing uniform nickel nanoparticles having superior dispersion stability.

2. Description of the Related Art

Recently, according to the miniaturization of electrical machines and apparatus, it is highly required for electrical parts to be miniaturized. Accordingly, in case of Multi-Layer Ceramic Condenser(MLCC), the miniaturized that have high capacity are required, also in case of circuit boards, multi-layer boards with high density and high-integration are required.

As to these MLCC and circuit board, precious metals such as silver, platinum or palladium have been used for inside conducting material or the electrode material. However, they are substituted with nickel particles for reducing production cost. In MLCC among these, a nickel electrode layer has lower density in comparison with the packing density of the molding product in the powder metallurgy and has higher degree of contraction according to sintering in curing than conducting layer, which cause high defective rate due to short of the nickel electrode layer or disconnection of wiring. To prevent these problems, the nickel powder should be fine particles, have a uniform narrow range of particle distribution, and exhibit superior particle distribution without agglomeration. For this, a method of manufacturing nickel nanoparticles having superior dispersion stability and uniform size is needed. However, the existing methods for manufacturing nickel nanoparticles could not provide nanoparticles having superior dispersion stability and uniformity of below 100 nm size.

According to an existing embodiment, though a method where particles are reduced by hydrogen under at a high temperature of about 1000° C. is provided, this method is not enough to be applied to internal electrode or internal wiring since its thermal history under a high temperature forces simultaneous generation and growth of particle so that the particles thus produced have a wide range of particle distribution and large particles of 1 micron among them. Further, according to another existing embodiment, though manufacturing of the micropowder having sub-micron level according to the wet reduction method is possible, the nanoparticles thus produced may be unequal due to plentiful variables of the reaction. Also the surface of the micropowder is not smooth, and though they may be produced in 200 nm-1 μm size, it is difficult to produce uniform particles of below 100 nm size.

SUMMARY

The invention provides a method of manufacturing nickel nanoparticles and nickel nanoparticles thus produced, having uniform size, superior dispersion stability and smooth surface, by reducing after forming a nickel-hydrazine complex in a reverse microemulsion.

Further, the invention provides a method of manufacturing nickel nanoparticles and nickel nanoparticles thus produced, having a narrow dispersion stability of below 100 nm, preferably 10-50 nm.

According to an embodiment of the invention, the invention may provide a production method of nickel nanoparticles including: forming an aqueous solution including nickel precursor, surfactant, and hydrophobic solvent; forming nickel-hydrazine complex by adding a reducing agent that includes hydrazine to the mixture; and producing nickel nanoparticles by adding an reducing agent to the mixture that includes the nickel-hydrazine complex.

Here the nickel precursor may be one or more compounds selected from the group consisting of $NiCl_2$, $Ni(NO_3)_2$, $NiSO_4$, and $(CH_3COO)_2Ni$. Here, the surfactant may be one or more compounds selected from the group consisting of cetyltrimethylammonium bromide, sodium dodecyl sulfate, sodium carboxymethyl cellulose, and polyvinylpyrrolidone. The surfactant may further include one or more cosurfactants selected from the group consisting of ethanol, propanol, and butanol. Here, the hydrophobic solvent may be one or more compounds selected from the group consisting of hexane, cyclohexane, heptane, octane, isooctane, decane, tetradecane, hexadecane, toluene, xylene, 1-octadecene, and 1-hexadecene.

Here, the nickel precursor may be included by 0.1-10 parts by weight with respect to 100 parts by weight of the aqueous solution.

Here, the surfactant may be included by 0.1-20 mole with respect to 1 mole of the distilled water that is added to the aqueous solution.

Further, the cosurfactant may be included by 20-40 part by weight with respect to 100 parts by weight of the distilled water.

Here, the hydrophobic solvent may be included by 30-60 parts by weight with respect to 100 parts by weight of the aqueous solution.

Further, the compound including the hydrazine may be one or more compounds selected from the group consisting of hydrazine, hydrazine hydrate, and hydrazine hydrochloride. According to an embodiment, the compound including the hydrazine may be included by 1-10 moles with respect to 1 mole of nickel ions supplied by the nickel precursor.

Here, the reducing agent may be sodium borohydride. According to an embodiment, the sodium borohydride may be included by 0.1-1 mole with respect to 1 mole of nickel ion supplied by the nickel precursor.

Further, the step of forming the aqueous solution to the step of producing nickel nanoparticles may be performed at 25-60° C., and the step of producing nickel nanoparticles may be performed for 0.5-2 hours.

Here, 10-50 nm of uniform particles having smooth surface and superior dispersion stability may be generated.

According to another aspect of the invention, in a manufacturing method of nickel nanoparticles by reverse microemulsion method, the invention may provide a method of producing nickel nanoparticles having uniform size, superior dispersion stability and smooth surface, the method includes: forming nickel hydrazine complex with a compound having hydrazine; and reducing this nickel hydrazine complex.

According to another aspect of the invention, the invention may provide nickel nanoparticles manufactured by the method set forth above.

Here, the invention may provide 10-50 nm of uniform nickel nanoparticles, having smooth surface and superior dispersion stability and including 90-97 weight % of nickel content.

According to another aspect of the invention, the invention may provide conductive ink including nickel nanoparticles set forth above.

According to another aspect of the invention, the invention may provide multi layer ceramic condenser including nickel nanoparticles set forth above as an electrode material.

DETAILED DESCRIPTION

Hereinafter, the method of producing nickel nanoparticles and nickel nanoparticles thus produced according to the present invention will be described specifically. Before explaining the embodiments of the invention, descriptions about reverse microemulsion will be given first.

In case of a non-soluble compound is dissolved in water or a hydrophilic material by adding a surfactant, micelles expand as the non-soluble compound becomes soluble. Here, the micelle system expanded by the solubilization is called as microemulsion. This microemulsion is a thermodynamically stable system, which has an oil-in-water form that the micelles are expanded in water or a hydrophilic system, a water-in-oil form that reverse micelles solubilizes a large amount of water or a hydrophilic material to expand in an oil or a hydrophobic system. A method using this water-in-oil form is called as a reverse microemulsion method.

The invention is about a method of forming nano sized uniform droplets produced by a surfactant which is introduced by this reverse microemulsion method.

Nickel nanoparticles having smooth surface and superior dispersion stability can be manufactured since the nickel nanoparticles are manufactured by first adding a compound including hydrazine in these micro droplets to form complexes, and then reducing these complexes to generate uniform nickel particles while preventing agglomeration with other nanoparticles. For this, a cosurfactant may be added according to an embodiment of the invention.

The method according to the invention includes forming an aqueous solution including a nickel precursor, a surfactant, and a hydrophobic solvent, forming a nickel-hydrazine complex by adding a compound that includes hydrazine to the mixture, manufacturing nickel nanoparticles by adding an reducing agent to the mixture that includes the nickel-hydrazine complex.

The method of the invention is different from the existing method that produces nanoparticles by reverse microemulsion, since nickel complexes are first formed and then reduced in order to manufacture nano-sized uniform particles stably. Further, through this procedure, there is an advantage that nickel nanoparticles having superior dispersion stability can be obtained.

Hereinafter, each step will be described in detail.

First, preparing reverse microemulsion with a nickel precursor that includes nickel ions and a surfactant is performed. Here, any compound that include nickel ions may be appropriately used for the nickel precursor without limitation, preferably salts of nickel. Examples of the nickel salts may include $NiCl_2$, $Ni(NO_3)_2$, $NiSO_4$, $(CH_3COO)_2Ni$, and mixtures thereof. The nickel precursor is added by 0.1-10 parts by weight with respect to 100 parts by weight of the total aqueous solution. If the nickel precursor is added by less than 0.1 part by weight, amount of generated nickel ions is so low that it may not be effective, and if this is added by more than 10 parts by weight, generated particles agglomerate each other, which is not proper to form nanoparticles. Here, the lower content of the nickel precursor becomes, the smaller nickel nanoparticles may be formed.

As the surfactant, cetyltrimethylammonium bromide (CTAB), sodium dodecylsulfate(SDS), sodium carboxymethyl cellulose(Na-CMC), polyvinylpyrrolidone(PVP) or mixtures thereof, may be used. Besides these surfactants, a cosurfactant can be added to form micro micelles stably. The cosurfactant may be an alcohol such as ethanol, propanol, or butanol. Here, the surfactant may be added by 0.1-20 moles with respect to 1 mole of distilled water that added in the aqueous solution, and this ratio is preferable since the surfactant can enclose sufficiently water droplets. Here, the higher content of the surfactant becomes, the smaller nickel nanoparticles can be formed. Further, the cosurfactant may be added by 20-40 parts by weight with respect to 100 parts by weight of the distilled water. If it is added by less than 20 parts by weight, it cannot stabilize microemulsions, and if it is added by more than 40 parts by weight, it may interrupt the function of surfactant and stable formation of microemulsion.

The nickel precursor and surfactant are mixed with hydrophobic solvent and distilled water, wherein for the hydrophobic solvent, hydrocarbon-based compounds such as hexane, cyclohexane, heptane, octane, isooctane, decane, tetradecane, hexadecane, toluene, xylene, 1-octadecene, or 1-hexadecene may be used individually or by mixing. The hydrophobic solvent may be added by 30-60 parts by weight with respect to 100 parts by weight of the aqueous solution, since stable microemulsion including nickel ions may be formed if the hydrophobic solvent is added within this range.

Next, forming nickel complexes in the reverse microemulsion is performed. For this, a compound including hydrazine is added, for example, hydrazine, hydrazine hydrate, hydrazine hydrochloride may be used individually or by mixing. Here, the hydrazine has the structure of $NH_2NH_2$, the hydrazine hydrate $NH_2NH_2 \cdot nH_2O$, the hydrazine hydrochloride $NH_2NH_3Cl$. The compound including hydrazine may be added by 1-10 moles with respect to 1 mole of nickel ions supplied from the nickel precursor. If it is added by less than 1 mole, the nickel complex is not sufficiently formed, and if it is added by more than 10 moles, it is not appropriate in aspect of efficiency.

Then, forming nickel particles by adding a reducing agent to the reverse microemulsion is performed. The reducing agent may be sodium borohydride($NaBH_4$). Here, sodium borohydride may be added by 0.1-1 mole with respect to 1 mole of nickel ions. If it is added by less than 0.1 mole, nickel-hydrazine complexes are not reduced sufficiently, and if it is added by more than 1 mole, it causes side excessive side. The reaction is performed for 0.5-2 hours after adding the reducing agent to form nanoparticles having narrow particle distribution of below 100 nm. If it takes less than 0.5 hour, the nickel ions are not sufficiently reduced, and if it takes more than 2 hours, nickel particles inappropriately overgrow and become unequal. The reaction is performed at 25-60° C., at higher than 60° C., the reaction occurs so rapidly that it is difficult to not only obtain uniform nanoparticles but control the growth of particles.

The method may further include separating the nickel nanoparticles manufactured by these procedure from the reverse microemulsion, and washing and drying the nanoparticles thus separated. The separating, washing, and drying may be performed by conventional methods that are used in the related art, e.g., centrifugation for separation, acetone and distilled water for washing, and a vacuum drying oven for drying.

Nickel nanoparticles and the method for manufacturing them were described above, more detailed descriptions will be given in greater detail with reference to specific examples.

EXAMPLE 1

Nickel chloride 18 g, PVP 18 g, ethanol 150 g, and toluene 150 g were added to 300 g of distilled water and the aqueous mixture was stirred at 40° C. to produce reverse microemulsion. 40 g of hydrazine hydrate was added to the reverse microemulsion aqueous solution and it was stirred for 30 minutes to form nickel-hydrazine complex. 0.04 mole of $NaBH_4$ was added to the reverse microemulsion including the nickel-hydrazine complex, and it was stirred for 1 hour to produce nickel particles by reduction. Nickel nanoparticles were separated from the reverse microemulsion by centrifugation. After washing the separated nanoparticles with acetone and distilled water 3 times, nickel nanoparticles were obtained by drying in a vacuum drying oven at 50° C. for 3 hours.

Figure 1:
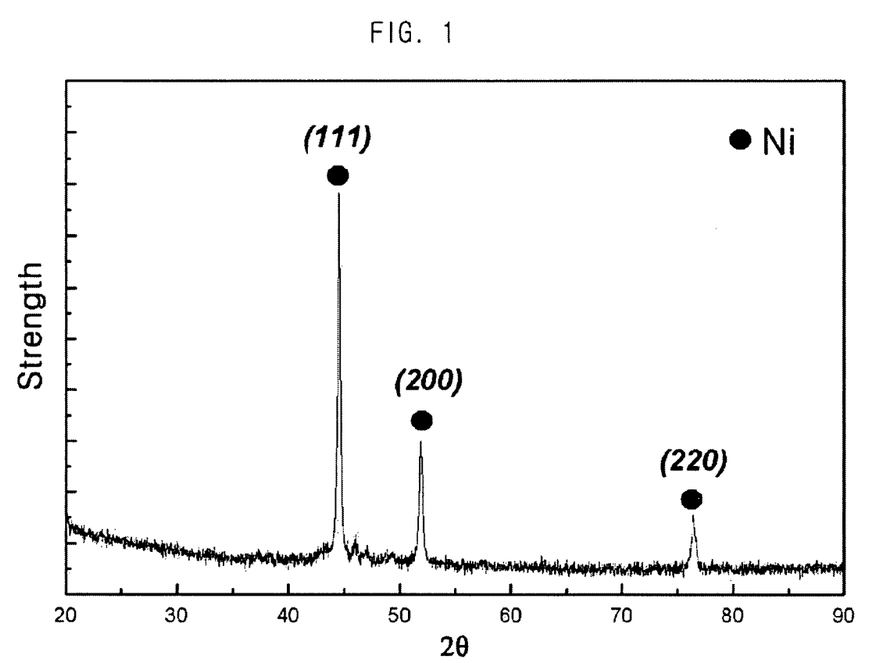
FIG. 1 is a graph representing the result of XRD analysis for the nickel nanoparticles produced according to an embodiment of the invention.

A graph representing the result of X-Ray diffraction examination(XRD) for nickel nanoparticles manufactured by example 1 is illustrated in FIG. 1. Referring to FIG. 1, it is shown that pure nickel crystals were generated without impurities and oxidized substances.

Figure 2:
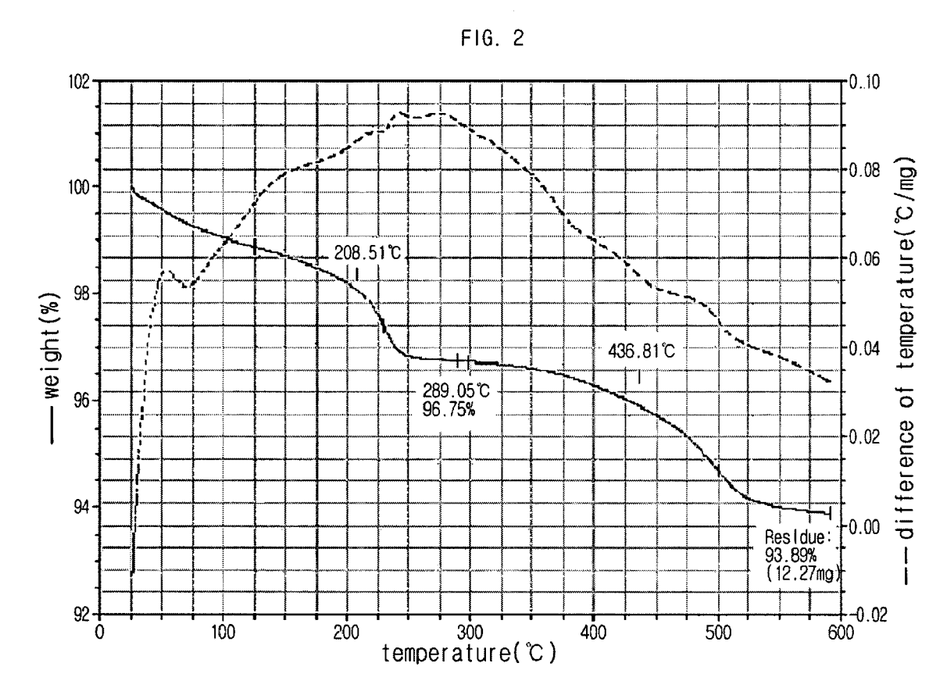
FIG. 2 is a graph representing the result of TGA analysis for the nickel nanoparticles produced according to an embodiment of the invention.

Further, a graph representing the result of thermogravimetric analysis(TGA) for the nickel nanoparticles produced by example 1 is illustrated in FIG. 2. Referring FIG. 2, it is shown that the content of organic substance is 3-10 weight % of the formed nickel nanoparticles. Namely, it is shown that nickel occupies 90-97 weight % of the formed nickel nanoparticles.

Figure 3:
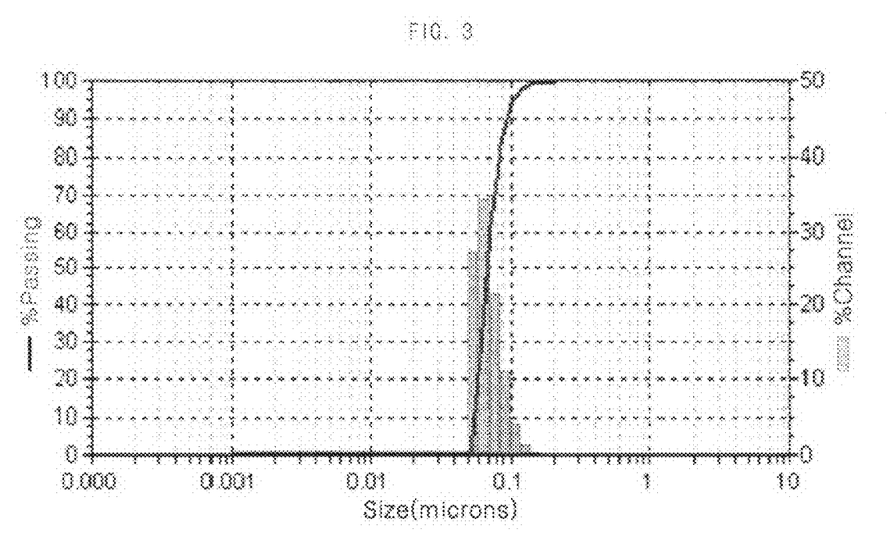
FIG. 3 is a graph representing the result of particle distribution of the metal nanoparticles produced according to embodiments of the invention.

Further, the result of particle distribution of nickel nanoparticles produced by example 1 is illustrated in FIG. 3. Referring FIG. 3, it is shown that uniform nanoparticles with narrow particle distribution were generated.

Figure 4:
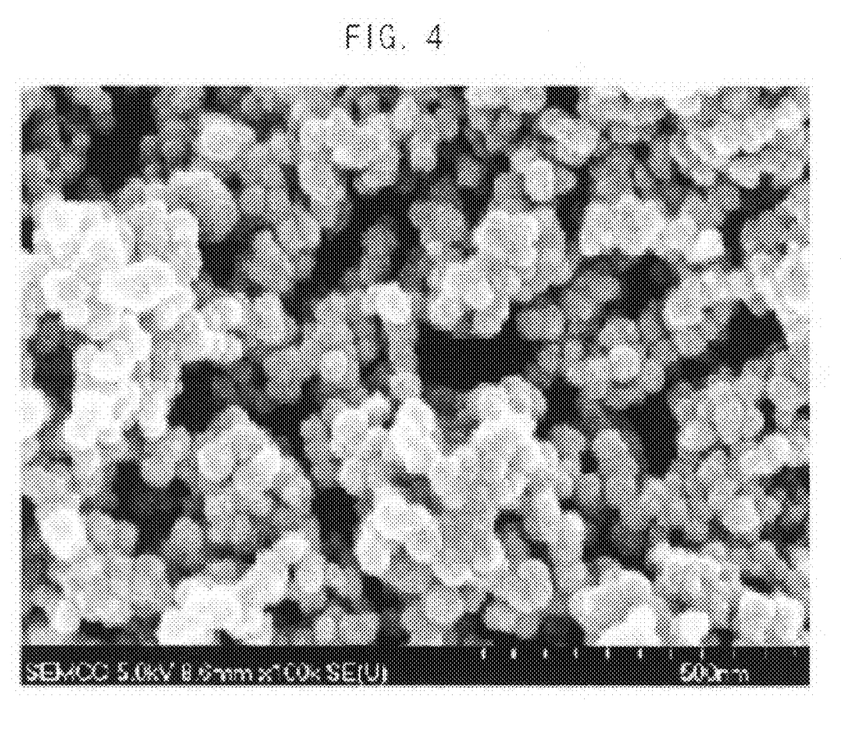
FIG. 4 is a photo representing the results of SEM analysis for the metal nanoparticles produced according to example 1 of the invention.

Further, a photo of Scanning Electron Microscope(SEM) of nickel nanoparticles produced by example 1 is illustrated in FIG. 4. Referring FIG. 4, it is shown that round uniform nanoparticles of 30-40 nm size were generated.

EXAMPLE 2

Nickel chloride 18 g, CTAB 20 g, ethanol 150 g, and toluene 150 g were added to 300 g of distilled water, and the aqueous mixture was stirred at 40° C. 30 g of hydrazine hydrate was added to the reverse microemulsion and it was stirred for 30 minutes to form nickel-hydrazine complex. 0.03 mole of $NaBH_4$ was added to the reverse microemulsion including the nickel-hydrazine complex, and it was stirred for 1 hour to produce nickel particles by reduction. Nickel nanoparticles were separated from the reverse microemulsion by centrifugation. After washing the separated nanoparticles with acetone and distilled water 3 times, nickel nanoparticles were obtained by drying in a vacuum drying oven at 50° C. for 3 hours.

Figure 5:
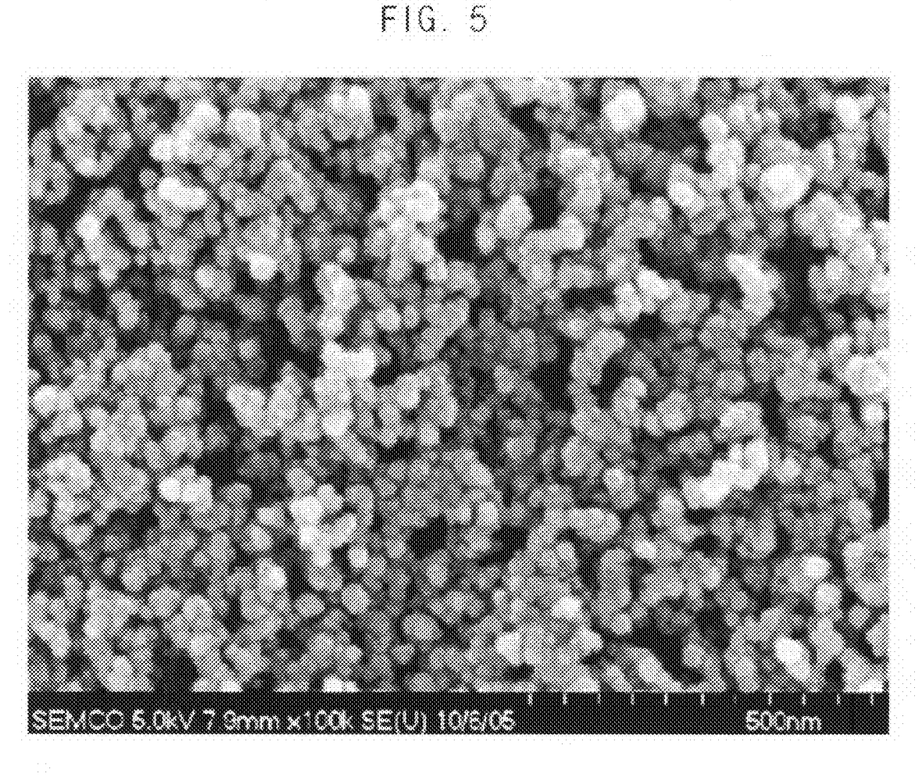
FIG. 5 is a photo representing the results of SEM analysis for the metal nanoparticles produced according to example 2 of the invention.

Further, a photo of Scanning Electron Microscope(SEM) of nickel nanoparticles produced by example 2 is illustrated in FIG. 5. Referring FIG. 5, it is shown that round uniform nanoparticles of 15-20 nm size were generated.

EXAMPLE 3

Nickel chloride 18 g, Na-CMC 12 g, ethanol 150 g, and toluene 150 g were added to 300 g of distilled water, and the aqueous mixture was stirred at 40° C. 30 g of hydrazine hydrate was added to the reverse microemulsion and it was stirred for 30 minutes to form nickel-hydrazine complex. 0.03 mole of $NaBH_4$ was added to the reverse microemulsion including the nickel-hydrazine complex, and it was stirred for 1 hour to produce nickel particles by reduction. Nickel nanoparticles were separated from the reverse microemulsion by centrifugation. After washing the separated nanoparticles with acetone and distilled water 3 times, nickel nanoparticles were obtained by drying in a vacuum drying oven at 50° C. for 3 hours.

Figure 6:
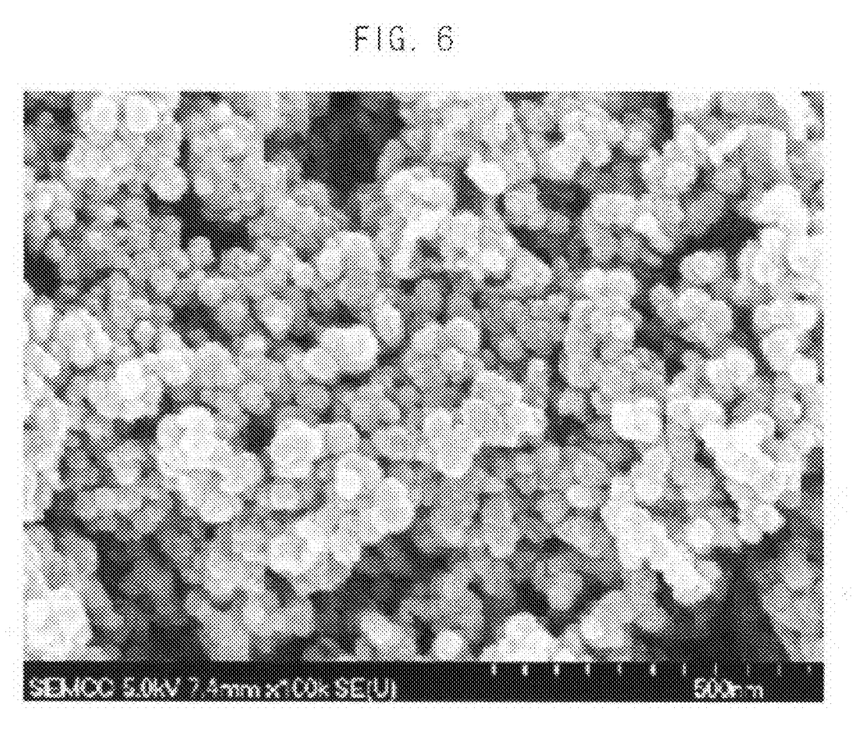
FIG. 6 is a photo representing the results of SEM analysis for the metal nanoparticles produced according to example 3 of the invention.

Further, a photo of SEM(Scanning Electron Microscope) of nickel nanoparticles produced by example 3 is illustrated in FIG. 6. Referring FIG. 6, it is shown that round uniform nanoparticles of 30-40 nm size were generated.

COMPARISON EXAMPLE 1

Nickel chloride 18 g, PVP 60 g, ethanol 150 g, and toluene 150 g were added to 300 g of distilled water, and the aqueous mixture was stirred at 40° C. 0.03 mole of $NaBH_4$ was added to the reverse microemulsion including the nickel-hydrazine complex, and it was stirred for 1 hour to produce nickel particles by reduction. Nickel nanoparticles were separated from the reverse microemulsion by centrifugation. After washing the separated nanoparticles with acetone and distilled water 3 times, nickel nanoparticles were obtained by drying with vacuum drying oven at 50° C. for 3 hours.

Though the nickel nanoparticles produced by comparison 1 was 15-20 nm, the shape was not uniform and agglomeration was so high that nanoparticles having proper distribution were not formed.

In example 1, 4 g of nickel nanoparticles were obtained from 18 g of nickel chloride. After the nickel nanoparticles were re-dispersed in ethanol and centrifuged at 3000 rpm for 5 minutes, 3.5 g of nickel nanoparticles having dispersion stability were obtained by removing precipitates. In examples 2 and 3, similar results were obtained, which were determined by same analyses.

On the contrary, in comparison example 1, when nanoparticles were re-dispersed as in example 1, it is noted that agglomeration was so high that nickel nanoparticles having dispersion stability were not obtained by centrifugation at 300 rpm for 5 minutes.

EXAMPLES 4 TO 10

Nickel nanoparticles were manufactured as in example 1, except that nickel chloride and each kind of surfactants were added as shown in Table 1. This is to confirm the relation between size of nickel nanoparticles and content of nickel precursor and surfactant. The size of manufactured nickel nanoparticles was determined and summarized in Table 1.

TABLE 1

|  | Nickel Chloride | Surfactant | | Mean particle size(nm) |
|---|---|---|---|---|
| Example 4 | 7 g | PVP | 14 g | 34 |
| Example 5 | 7 g | PVP | 35 g | 18 |
| Example 6 | 40 g | PVP | 14 g | 55 |
| Example 7 | 2 g | Na-CMC | 6 g | 35 |
| Example 8 | 7 g | Na-CMC | 6 g | 52 |
| Example 9 | 2 g | CTAB | 22 g | 8 |
| Example 10 | 7 g | CTAB | 22 g | 17 |

As shown in Table 1, the lower the content of nickel precursor is and the higher the content of surfactant is, the smaller size of nickel nanoparticles are produced.

Production of Conductive Ink

The nickel nanoparticles were added to diethylene glycol butyl ether acetate and an aqueous solution of ethanol, and dispersed with an ultra sonicator to produce 20 cps of conductive ink. The conductive ink thus produced may be printed on a circuit board via inkjet techniques to form conductive wiring.

Multi Layer Ceramic Condenser

Nickel powders manufactured according to examples 1-3 were dispersed on a binder to produce nickel paste having high viscosity. After the past was coated by screen printing on a ceramic conductive layer of barium titanate and dried, multilayers were then stacked thereon, pressed, and calcined at 1300° C. under reductive condition to produce MLCC.

Further, an internal electrode may be formed by calcining under reductive condition after the conductive ink set forth above is inkjet printed on the ceramic conductive layer of barium titanate and dried.

Although a few embodiments of the present invention have been shown and described, it will be appreciated by those skilled in the art that changes may be made in these embodiments without departing from the principles and spirit of the present invention, the scope of which is defined in the appended claims and their equivalents.

What is claimed is:

1. A method of manufacturing nickel nanoparticles, said method comprising:
    forming an aqueous solution including a nickel precursor, a surfactant, a hydrophobic solvent and distilled water, wherein said hydrophobic solvent is one or more compounds selected from the group consisting of hexane, cyclohexane, heptane, octane, isooctane, decane, tetradecane, hexadecane, toluene, xylene, 1-octadecene, and 1-hexadecene;
    forming nickel-hydrazine complex by adding a compound including hydrazine to said aqueous solution; and
    manufacturing nickel nanoparticles by adding a reducing agent to said aqueous solution including said nickel-hydrazine complex.

2. The method of claim 1, wherein said nickel precursor is one or more compounds selected from the group consisting of $NiCl_2$, $Ni(NO_3)_2$, $NiSO_4$, and $(CH_3COO)_2Ni$.

3. The method of claim 2, wherein said nickel precursor is added by 0.1-10 parts by weight with respect to 100 parts by weight of the aqueous solution.

4. The method of claim 1, wherein said surfactant is one or more compounds selected from the group consisting of cetyltrimethylammonium bromide, sodium dodecyl sulfate, sodium carboxymethyl cellulose, and polyvinylpyrrolidone.

5. The method of claim 4, wherein said surfactant is added by 0.1-20 moles with respect to 1 mole of the distilled water that is added to the aqueous solution.

6. The method of claim 1, wherein said surfactant further includes one or more cosurfactants selected from the group consisting of ethanol, propanol, and butanol.

7. The method of claim 6, wherein said cosurfactant is added by 20-40 parts by weight with respect to 100 parts by weight of the distilled water.

8. The method of claim 1, wherein said hydrophobic solvent is added by 30-60 parts by weight with respect to 100 parts by weight of the aqueous solution.

9. The method of claim 1, wherein said compound including the hydrazine is one or more compounds selected from the group consisting of hydrazine, hydrazine hydrate, and hydrazine hydrochloride.

10. The method of claim 9, wherein said compound including said hydrazine is added by 1-10 moles with respect to 1 mole of nickel ions supplied by the nickel precursor.

11. The method of claim 1, wherein said reducing agent is sodium borohydride.

12. The method of claim 11, wherein said sodium borohydride is added by 0.1-1 mole with respect to 1 mole of nickel ions supplied by the nickel precursor.

13. The method of claim 1, wherein forming the aqueous solution, forming nickel-hydrazine complex or manufacturing nickel nanoparticles is performed at 25-60° C.

14. The method of claim 1, wherein said step of manufacturing nickel nanoparticles is performed for 0.5-2 hours.

15. The method of claim 1, wherein said nickel nanoparticles have a uniform size of 10-50 nm, smooth surface and superior dispersion stability.

* * * * *